(12) United States Patent
Unger et al.

(10) Patent No.: US 11,197,381 B2
(45) Date of Patent: Dec. 7, 2021

(54) MODULAR ELECTRONIC HOUSING FOR HOUSING ELECTRONIC COMPONENTS AND A METHOD FOR PRODUCING THE SAME

(71) Applicant: PHOENIX CONTACT GMBH & CO. KG, Blomberg (DE)

(72) Inventors: Eduard Unger, Herford (DE); Helmut Eusterholz, Paderborn (DE); Carsten Paulini, Detmold (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 157 days.

(21) Appl. No.: 16/328,285

(22) PCT Filed: Aug. 24, 2017

(86) PCT No.: PCT/EP2017/071374
§ 371 (c)(1),
(2) Date: Feb. 26, 2019

(87) PCT Pub. No.: WO2018/041725
PCT Pub. Date: Mar. 8, 2018

(65) Prior Publication Data
US 2020/0245474 A1    Jul. 30, 2020

(30) Foreign Application Priority Data
Aug. 29, 2016  (LU) .......................................... 93185

(51) Int. Cl.
*H05K 5/00* (2006.01)
*H05K 7/14* (2006.01)

(52) U.S. Cl.
CPC .......... *H05K 5/006* (2013.01); *H05K 7/1404* (2013.01)

(58) Field of Classification Search
USPC .......... 361/752, 796, 800; 174/138 E, 138 G
See application file for complete search history.

(56) References Cited

U.S. PATENT DOCUMENTS

| 4,473,204 | A |   | 9/1984  | Bohm          |                       |
|-----------|---|---|---------|---------------|-----------------------|
| 4,744,039 | A | * | 5/1988  | Suzuki        | B25J 9/1692           |
|           |   |   |         |               | 700/193               |
| 5,267,125 | A | * | 11/1993 | Liu           | H01R 4/64             |
|           |   |   |         |               | 361/816               |
| 5,375,040 | A |   | 12/1994 | Cooper et al. |                       |
| 5,434,747 | A | * | 7/1995  | Shibata       | H05K 9/0039           |
|           |   |   |         |               | 174/51                |
| 5,757,617 | A | * | 5/1998  | Sherry        | G06F 1/184            |
|           |   |   |         |               | 206/387.15            |

(Continued)

FOREIGN PATENT DOCUMENTS

CN  202721899 U  2/2013
EP    0033850 A2  8/1981

*Primary Examiner* — Hung S. Bui
(74) *Attorney, Agent, or Firm* — Leydig, Voit & Mayer, Ltd.

(57) ABSTRACT

A modular electronic housing includes: a housing series body whose receiving chamber houses an electronic component; and a maintaining device for maintaining the electronic component on the housing series body, the maintaining device having at least one holding body for the electronic component, which holding body is materially bonded to the housing series body in a bonding position.

20 Claims, 9 Drawing Sheets

(56) References Cited

U.S. PATENT DOCUMENTS

| | | | | |
|---|---|---|---|---|
| 5,777,856 | A * | 7/1998 | Phillips | H05K 9/0037 361/741 |
| 5,963,432 | A | 10/1999 | Crowley | |
| 6,253,266 | B1 * | 6/2001 | Ohanian | H05K 7/1438 361/788 |
| 6,906,266 | B2 * | 6/2005 | Verrigni | G06F 1/184 174/138 G |
| 7,564,698 | B2 * | 7/2009 | Oh | H01R 4/64 361/796 |
| 7,583,517 | B2 * | 9/2009 | Hartman | H05K 7/142 361/807 |
| 7,911,787 | B2 * | 3/2011 | Cheng | H05K 5/0013 361/690 |
| 2013/0308281 | A1 * | 11/2013 | Motoori | H05K 5/0004 361/746 |
| 2014/0211432 | A1 | 7/2014 | Lozano et al. | |
| 2015/0064962 | A1 * | 3/2015 | Baer | H01R 13/521 439/487 |
| 2016/0041587 | A1 * | 2/2016 | Chu | G06F 1/1658 361/679.27 |

* cited by examiner

MODULAR ELECTRONIC HOUSING FOR HOUSING ELECTRONIC COMPONENTS AND A METHOD FOR PRODUCING THE SAME

CROSS-REFERENCE TO PRIOR APPLICATIONS

This application is a U.S. National Phase application under 35 U.S.C. § 371 of International Application No. PCT/EP2017/071374, filed on Aug. 24, 2017, and claims benefit to Luxembourgian Patent Application No. LU 93185, filed on Aug. 29, 2016. The International Application was published in German on Mar. 8, 2018 as WO 2018/041725 under PCT Article 21(2).

FIELD

The invention relates to a modular electronic housing having a housing series body whose receiving chamber houses an electronic component, as well as a method for series production of a modular electronic housing.

BACKGROUND

Modular electronic housings of the type in question are known from the prior art. They serve to be able to accommodate different electronic components, whereby they enable different combinations or configurations. In terms of their equipment, they can thus be adapted variably and flexibly to different fields of application and requirements.

For securely maintaining different electronic components in the receiving chamber, their housing series bodies are provided with a maintaining device which allows a different equipment of the receiving chamber. The pertinent maintaining device is correspondingly designed for this purpose.

SUMMARY

In an embodiment, the present invention provides a modular electronic housing, comprising: a housing series body having a receiving chamber housing an electronic component; and a maintaining device configured to maintain the electronic component on the housing series body, the maintaining device having at least one holding body for the electronic component, which holding body is materially bonded to the housing series body in a bonding position.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a modular electronic housing whose receiving chamber can be flexibly equipped in order to thereby enable various configurations. The invention is first achieved by the idea of providing a variety of maintaining devices on the housing series body in order, by means of variety, to be able to accommodate different electronic components in the housing series body. Furthermore, the invention is achieved by the idea of designing the maintaining devices in such a way that these can be used for maintaining different electronic components.

In an embodiment, the present invention achieves the aim that it poses in a surprisingly simple manner, in that the maintaining device has at least one holding body for maintaining the electronic component, which is materially bonded to the housing series body in a bonding position.

Within the context of the invention, a bonding position is characterized in that the holding body is positioned on the housing series body so as to maintain an electronic component. In the bonding position of the holding body, a bonding to the housing series body takes place in order to thereby be able to maintain the electronic component on the housing series body.

The housing series body, which, as a serial product, is provided as a bulk commodity, thereby simply and cost-effectively succeeds in being able to be adapted and configured, via the flexible accommodation of corresponding electronic components.

The invention leads to the advantage that the final configuration of a modular electronic housing can be carried out at a very late point in time in the manufacturing process, at which the housing series body has already been produced. The necessary adaptation may advantageously be very flexibly performed on the basis of the invention, without having to modify the design of the housing series body.

For a modular electronic housing according to the invention, as an additional advantage, a wide range of applications, which can be covered cost-effectively and via rapid adaptation, results.

According to the invention, this is possible in that the housing series body can be adapted almost as desired via the maintaining device provided according to the invention.

A material bonding of the holding body to the housing series body may be realized in various ways. For this purpose, in a further advantageous development of the invention, it is provided that the holding body be bonded to the housing series body—in particular, to an inner housing wall—by means of a welded or adhesive bond.

Furthermore, the advantage results that a secure bonding is possible by introducing a fastener. The present invention thereby provides that a welded joint may also be combined with an adhesive bond.

With the use of plastics, of which the housing series body or the holding body may consist, at least in sections, various adhesives or welding methods may be employed. For example, it is also possible to achieve a material bond, while dispensing with a bonding medium, by means of an ultrasonic welding method, so that the bonding may take place independently of a fastener, which may result in cost advantages.

For this purpose, in a further development of the invention, it is provided that a bonding medium be introduced between holding body and housing series body, in order to materially bond the holding body with the housing series body. The advantage thereby arises that a corresponding bonding medium may be used for it, depending upon the desired bonding force. With use of a different welding method, different welding materials may therefore be introduced into the weld. Furthermore, according to the invention, the use of different substances is possible.

In a further advantageous development of the invention, it is provided that the holding body be bonded to the housing series body by means of an adhesive—in particular, a pressure-sensitive adhesive, and, preferably, an adhesive tape.

Adhesives are available in a broad palette with different properties, whereby a holding body securely bonded with the housing series body can occur. Furthermore, there is the advantage that such adhesives are available at low cost. Moreover, the advantage results that the holding body can be readjusted, or the position of an incorrectly positioned holding body can be corrected, in a simple manner.

The invention initially provides that a holding body be selectively positionable on the housing series body. In order to enable a simple and repeatable positioning of the holding body on the housing series body, in a further advantageous development, the invention provides that the holding body be configured and designed for positioning on the housing series body by a positioning element—in particular, a positioning template.

The advantage thereby results that small batches may also be produced economically, without being linked with losses in the precision of the positioning of holding bodies and electronic components held thereon. Furthermore, the advantage results that a secure positioning is made possible by the positioning element, such that subsequent adjustment may be omitted. Against this background, the use of positioning element according to the invention also supports the secure creation of different equipment variants of a modular electronic housing.

According to the invention, a positioning template is designed and configured in such a way that, for positioning the holding body, it interacts with said holding body via a shape coding. The shape coding may be formed, in particular, at the foot part of the holding body. Accordingly, the positioning template may have a recess for the holding body, which recess is formed, at least in sections, to be complementary to the shape coding of the holding body or its foot part.

An alignment/positioning of the positioning template may, analogously, take place at housing series body, which may be achieved via interaction of shaped sections that form a shape coding.

In order to realize as space-saving an arrangement of an electronic component in the receiving chamber as possible, or in order to realize the electronic housing with the smallest dimensions possible, in an additional advantageous development of the invention, it is provided that the holding body have at least one head part for holding the electronic component and one foot part for bonding with the housing series body, which head part and foot part are arranged offset from each other in such a way that, in the bonding position, the electronic components maintained on the holding body predominantly—in particular, completely—cover or overlap the foot part of the holding body.

In order to be able to maintain the electronic component on the holding body—optimally, on an edge of the electronic component—in a further advantageous development of the invention, it is provided that the head part be arranged on an outer edge of the foot part.

To arrange the head part on the foot part, according to the invention, a connecting segment is provided that, in a further advantageous development of the invention, is designed to be L-shaped in its longitudinal cross-section, such that the head part is connected to the foot part by this L-shaped connecting segment. The longitudinal cross-section yields a section along a plane through the entire connecting segment.

Furthermore, according to the invention, it is provided that a holding body may be designed in various ways, in order to be able to receive an electronic component. For this purpose, in a further advantageous development of the invention, it is provided that the holding body have at least one groove for maintaining the electronic component. Linked with this is the advantage of a simple introduction of the electronic component into the receiving chamber, wherein the groove favors a simple alignment. According to the invention, several grooves may also be present by means of which, among other things, a flexible positioning capability of the electronic component may be achieved—for example, at different height positions.

The electronic component may be held in various ways on the holding body. For this purpose, in a further advantageous development of the invention, it is provided that the electronic component, via positive, non-positive, or material bonding, as well as in a combination of positive, and/or non-positive, and/or material bonding, be maintained on the holding body.

A non-positive maintenance may take place according to the invention—for example, via clamping. Within the scope of the invention, a positive connection may, for example, be achieved, in that screwed connection means are provided. Moreover, it is also possible to provide a tongue-and-groove connection as a positive connection type.

The configuration of the maintenance of the electronic component on the holding body is possible within wide limits. However, the electronic component is preferably maintained on the holding body so as to be removable, so that the electronic component may be removed from the holding body non-destructively. For this purpose, it is possible to use an aforementioned screw connection in order to enable, on the one hand, secure maintenance, and, on the other, an easy (de)mounting capability of the electronic component.

An electronic component may, for example, be an electrical/electronic component, an assembly consisting of electrical/electronic components, as well as a combination of electronic components—for example, a populated circuit board. For this purpose, in a further advantageous development of the invention, it is provided that the electronic component be a circuit board, wherein, within the scope of the invention, the term, circuit board, encompasses circuit boards populated with electrical/electronic components/assemblies.

It is thereby possible to progressively reduce the space requirement for the arrangement of an electronic circuit, or the electronic components required for this. Moreover, advantages thereby result in the interchangeability of the electronic component. Also, it is possible to facilitate the production of a modular electronic housing formed according to the invention, whereby cost and time advantages result. Furthermore, various fields of use or requirements may be served by means of a circuit board, whereby the spectrum of application of a modular electronic housing according to the invention is increased.

A modular electronic housing formed according to the invention, as well as a holding body used therewith, may be produced via various materials or material combinations.

In order to realize a modular electronic housing according to the invention, a housing series body may consist of a plastic which may be serially mass-produced inexpensively—for example, in an injection molding process.

The use of a plastic offers various advantages. In addition to cost-effective production, among other things, advantages also result due to insulating properties, as well as a good balance between weight and loading capacity of plastic.

For this purpose, a further advantageous development of the invention takes into account that the holding body and/or the housing series body consist/consists, at least in segments, of a plastic or a material featuring plastic. It is thereby possible that the holding body, in particular, be designed as one piece—preferably, as one part.

The invention also includes a method for manufacturing a modular electronic housing, as this may be a modular electronic housing as previously described.

In this, an electronic component is introduced into the receiving chamber of a housing series body of the electronic housing and is maintained in the receiving chamber by a maintaining device.

In an embodiment, a method according to the present invention provides that the maintaining device has at least one holding body, which is positioned by a positioning element in a bonding position in the receiving chamber and, in the bonding position, is materially bonded to the housing series body in such a way that the electronic component arranged thereon is maintained on the housing series body at least by the holding body.

Further advantageous developments of a method according to the invention, including the advantages and features, as well as properties that are linked therewith, are herein described as using a modular electronic housing according to the invention, such that these also apply to a method according to the invention and, in effect, characterize a method according to the invention. Reference is made thereto, with this as background, in order to avoid duplicate representations.

In the following, given the same or similar design, for a better overview, the description is reduced to the differences between the exemplary embodiments or figures. The details of the exemplary embodiments shown in the figures, which details are cited with regard to the features, thereby also complement one another, such that the pertinent details also, reasonably or analogously, apply comprehensively.

In the following, the exemplary embodiment of a modular electronic housing 2 according to the invention is also abbreviated as the term, electronic housing 2.

Figure 1:
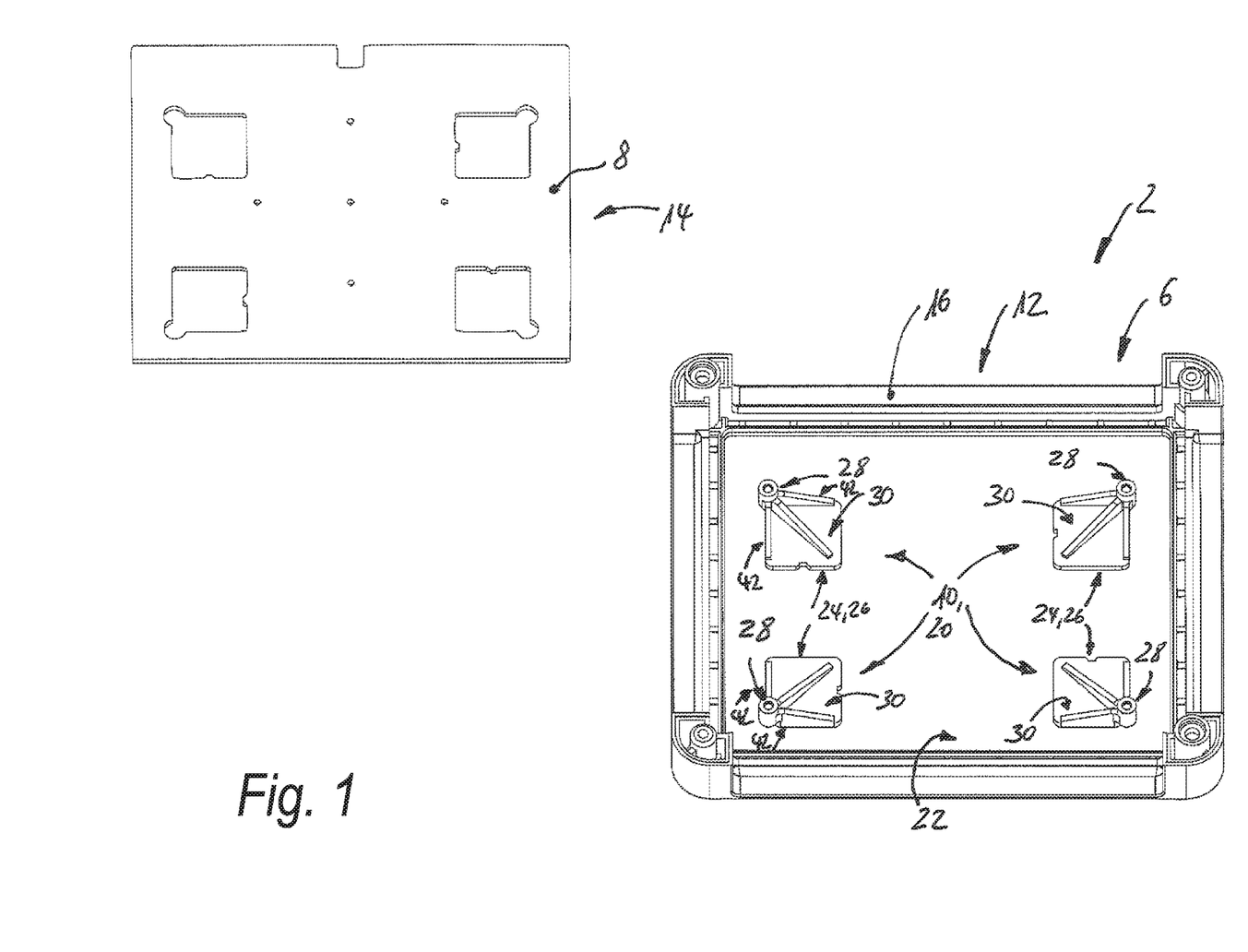
FIG. 1 a first exemplary embodiment of a modular electronic housing according to the invention, in an open state, and a positioning template for positioning the holding body, in a schematic perspectival view.
Figure 3:
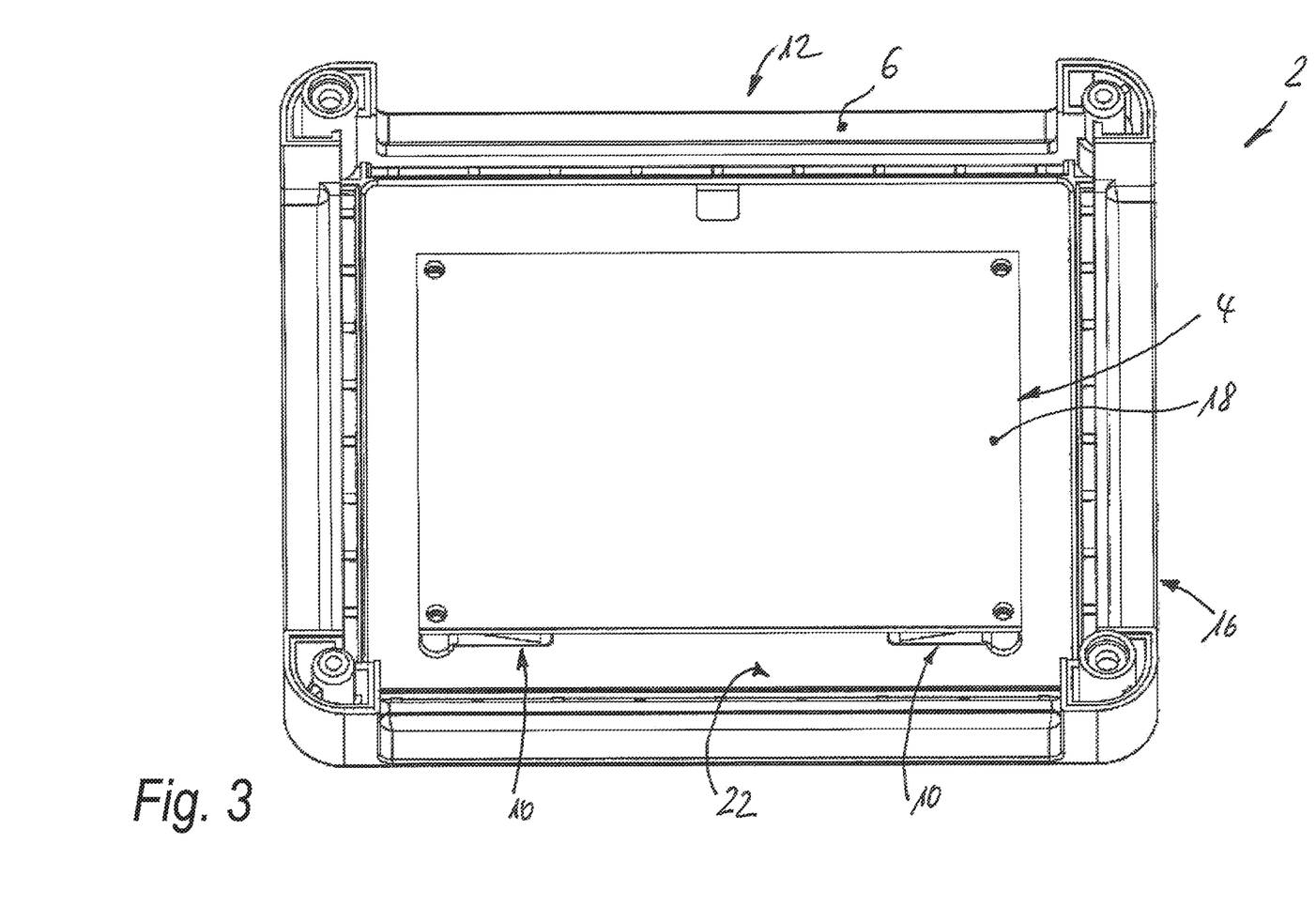
FIG. 3 the first exemplary embodiment of a modular electronic housing according to the invention from FIG. 1, with an arrangement of a circuit board as an example of an electronic component at the holding bodies, in a representation that is otherwise the same as FIG. 1.

FIG. 1 shows a first exemplary embodiment of a modular electronic housing 2 according to the invention in an open state, in which it is open for an installation of an electronic component 4 (shown in FIG. 3). A lower housing part 6 has thereby been removed from the upper housing part (not shown).

Furthermore, a positioning template 8 for positioning the holding bodies 10 used in the receiving chamber of the electronic housing 2 is shown, which is an example of a positioning element 14. The representation thereby takes place in a schematic perspectival view.

The positioning template 8 enables a positioning of the holding body 10 or of all holding bodies 10 via coordination with the shape codings formed at the holding body 10, which are formed at the respective foot part. They result via the specific design of the outer circumference of the foot part, which is reproduced in the positioning template 8. Similarly, the design of an outer circumference of the positioning template 8 coordinates with an inner contour of the inner housing wall 22 in order to enable positioning of the positioning template 8 on the housing body 16.

A method according to the invention, whose individual steps are clear using the embodiment of the electronic housing 2, serves for the production of the electronic housing 2.

The electronic housing 2 is provided with a housing series body 16 whose receiving chamber 12 houses an electronic component 4 that is designed as a circuit board 18 (shown in FIG. 3). The circuit board 18 is shown in—among others—FIG. 3 in a highly-schematized representation.

To maintain the electronic component 4 on the housing series body 16, maintaining devices 20 are provided, which in turn have four holding bodies 10 (all provided with the same reference numeral) for the electronic component 4, wherein the respective holding body 10 is materially bonded to the housing series body 16 in the shown bonding position. For this purpose, the holding body 10 is bonded by adhesive bonding to an inner housing wall 22 of the housing series body 16, which, in the shown exemplary embodiment, serves to enclose the receiving chamber 12.

For the adhesive bonding, a bonding medium 24 (uniformly provided with the same reference numeral) is introduced between the respective holding body 10 and the housing series body 16, which bonding medium 24 is formed by an adhesive 26 (uniformly provided with the same reference numeral). A pressure-sensitive adhesive has been chosen as adhesive 26.

The respective holding body 10 also has a respective head part 28 (uniformly provided with the same reference numeral) for maintaining the electronic component 4, and a foot part 30 for bonding to the housing series body 16, which head part and foot part are arranged offset relative to each other such that, in the bonding position, the electronic component 4 held on the holding body 10 predominantly overlaps the foot part 30, as shown in FIG. 3.

Figure 6:
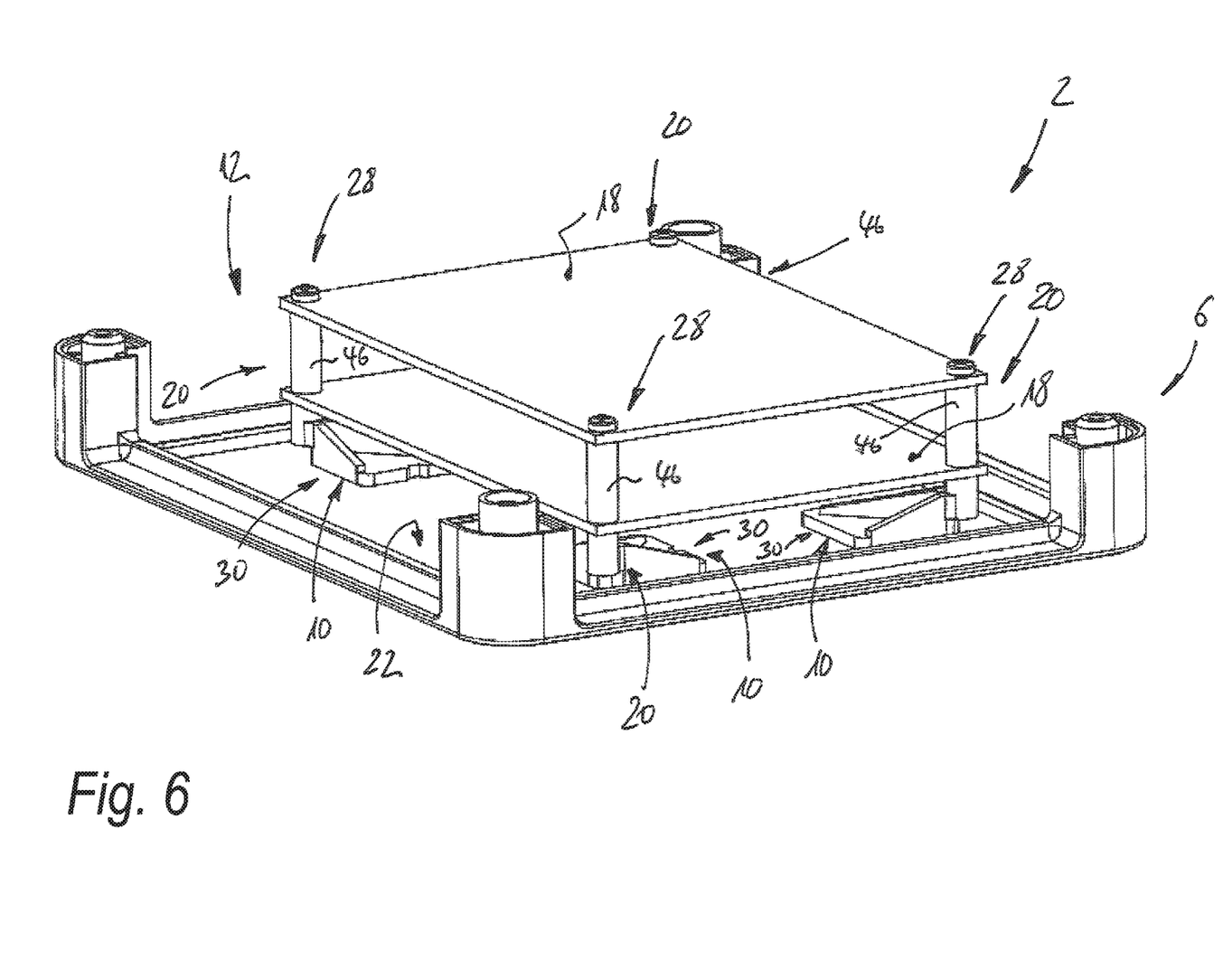
FIG. 6 a fourth exemplary embodiment of a modular electronic housing according to the invention, with an arrangement of two circuit boards in a schematic perspectival view.

The adhesive 26 is/will be applied on the holding body side to a bonding surface 32 (not visible in FIG. 1, but identified in FIGS. 7 and 8) which is formed at the foot part 30 and faces towards the housing series body 16 or the inner housing wall 22 in the bonding position of the respective holding body 10, as is illustrated using FIG. 6.

The holding body 10 is brought into a bonding position, in which it is connected to the housing series body 16, with the aid of the positioning template 8. For this purpose, the respective holding body 10 is configured and designed for positioning on the housing series body 16 by means of the positioning template 8.

Further details are shown in further figures, to which reference is made at this point. The outer edge of the foot part 30, identified by the reference numeral 42 in FIG. 1, will be explained in more detail using FIG. 7.

Figure 2:
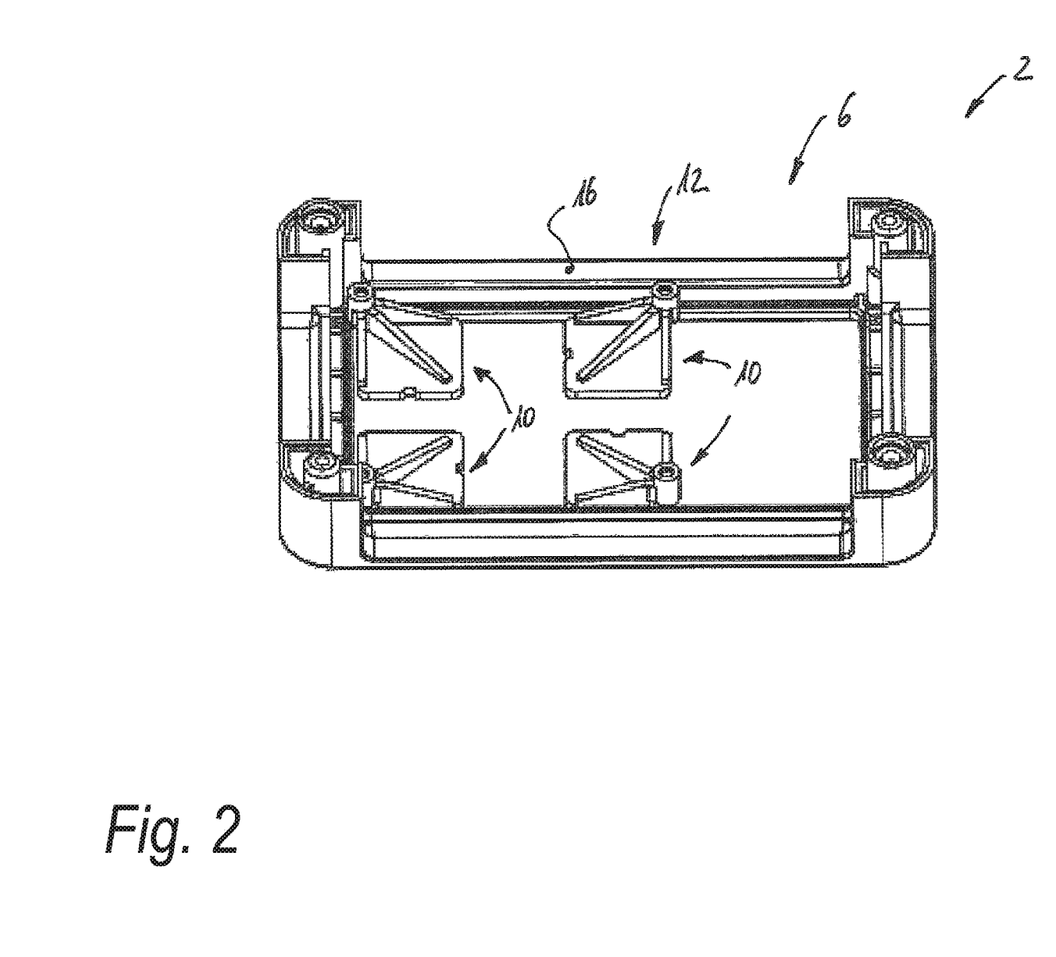
FIG. 2 the first exemplary embodiment of a modular electronic housing according to the invention from FIG. 1, with an arrangement of the holding bodies in bonding position, in a representation that is otherwise the same as FIG. 1.

FIG. 2 shows the first exemplary embodiment of a modular electronic housing 2 according to the invention from FIG. 1, with an arrangement of holding bodies 10 in their respective bonding positions, in a representation that is otherwise the same as FIG. 1.

In this exemplary embodiment, the holding bodies 10 are arranged in a different bonding position on the housing series body 16, whereby it is clarified that the same housing series body 16 can be used for different size formats of the electronic component 4, which here is likewise a circuit board 18 populated with electronic components. Further details are shown in further figures, to which reference is made at this point.

FIG. 3 shows the first exemplary embodiment of a modular electronic housing 2 according to the invention, in which the circuit board 18 is arranged as an example of an electronic component 4 on the positioned holding bodies 10. The holding bodies 10 are thereby positioned at the inner housing wall 22 and materially bonded thereto.

Figure 4:
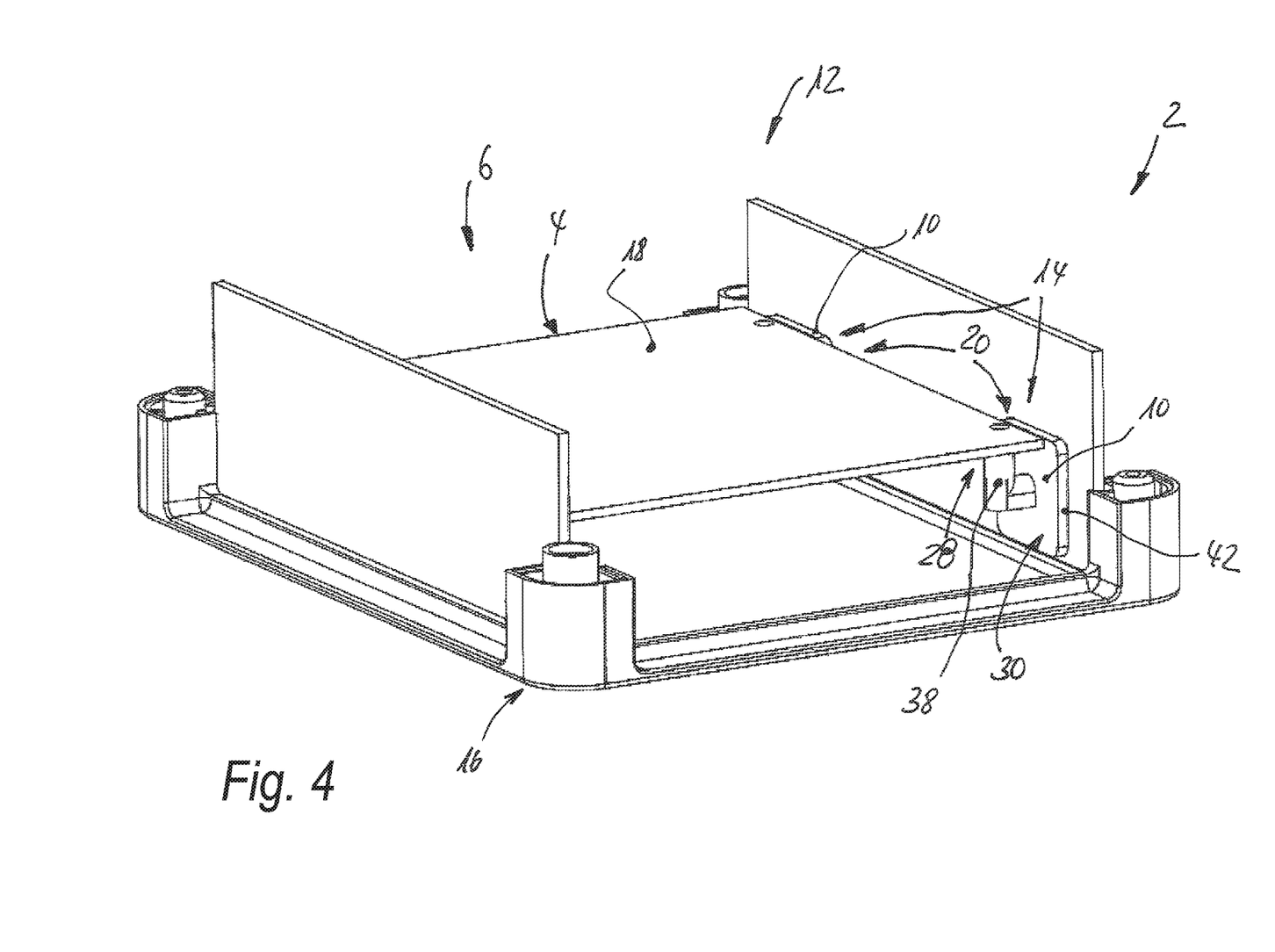
FIG. 4 a second exemplary embodiment of an electronic housing according to the invention, with an arrangement of a circuit board on an inner side wall, in a schematic perspectival view.

FIG. 4 illustrates a second exemplary embodiment of a modular electronic housing 2 according to the invention, with an arrangement of a circuit board 18 on an inner housing wall 22, in a schematic perspectival view. The head part 28 is thereby connected to the foot part 30 by an L-shaped connecting segment 38. The outer edge of the foot part 30, identified by reference numeral 42 in this figure, will be explained in more detail in FIG. 7.

Figure 5:
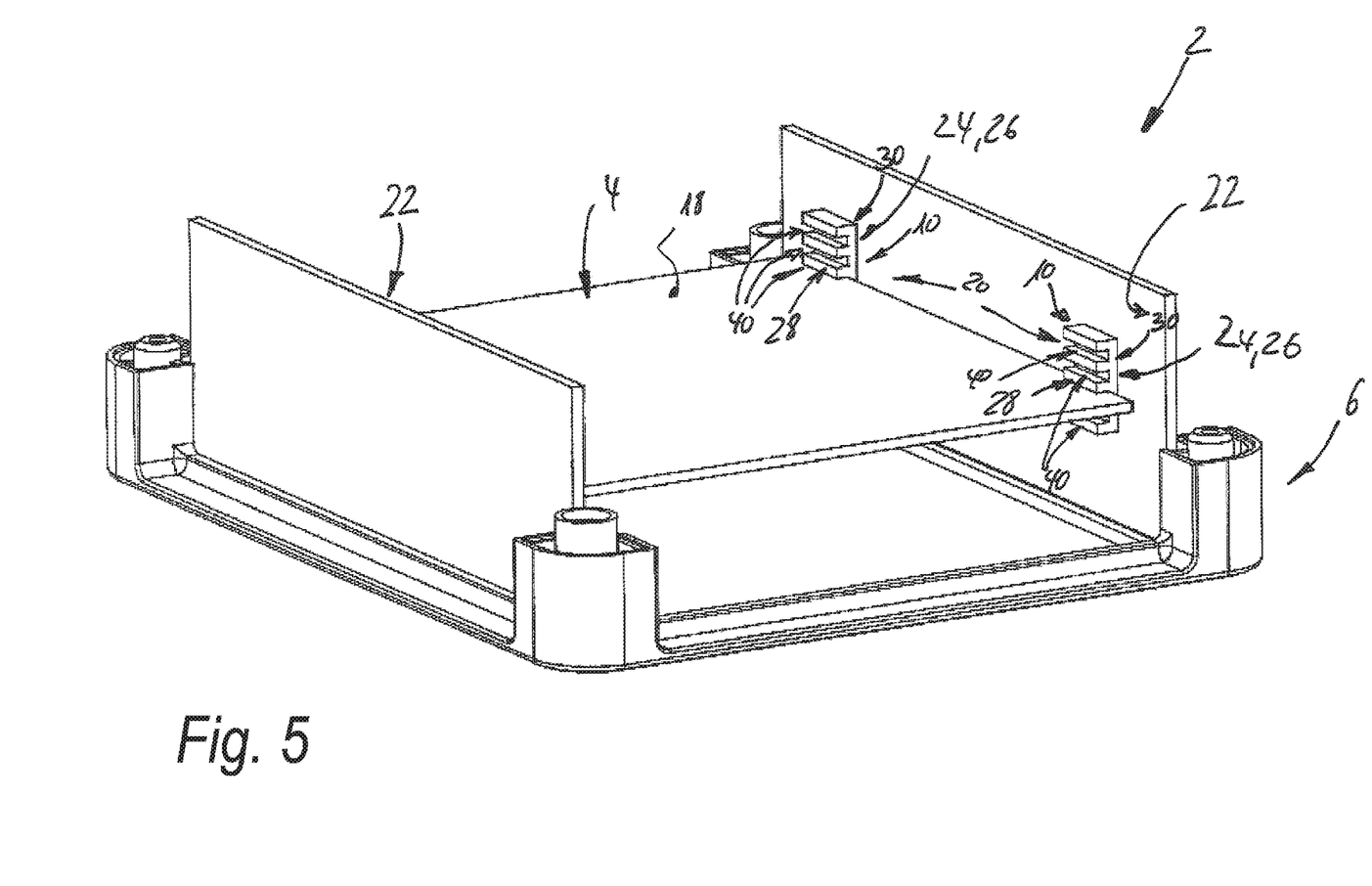
FIG. 5 a third exemplary embodiment of an electronic housing according to the invention, with an arrangement of a circuit board on an inner side wall, in a schematic perspectival view.

FIG. 5 shows a third exemplary embodiment of a modular electronic housing 2 according to the invention, with an arrangement of a circuit board 18 at an inner side wall, in a schematic perspectival view, wherein the holding body 10 has several grooves 40 for maintaining the electronic component 4 at various height positions.

FIG. 6 shows a fourth exemplary embodiment of a modular electronic housing 2 according to the invention, with an arrangement of two circuit boards 18, in a schematic perspectival view, wherein the circuit boards 18 are arranged atop one another on the four holding bodies 10 by means of four spacers 46, one of which is occluded by the selected perspective in FIG. 6.

Figure 7:
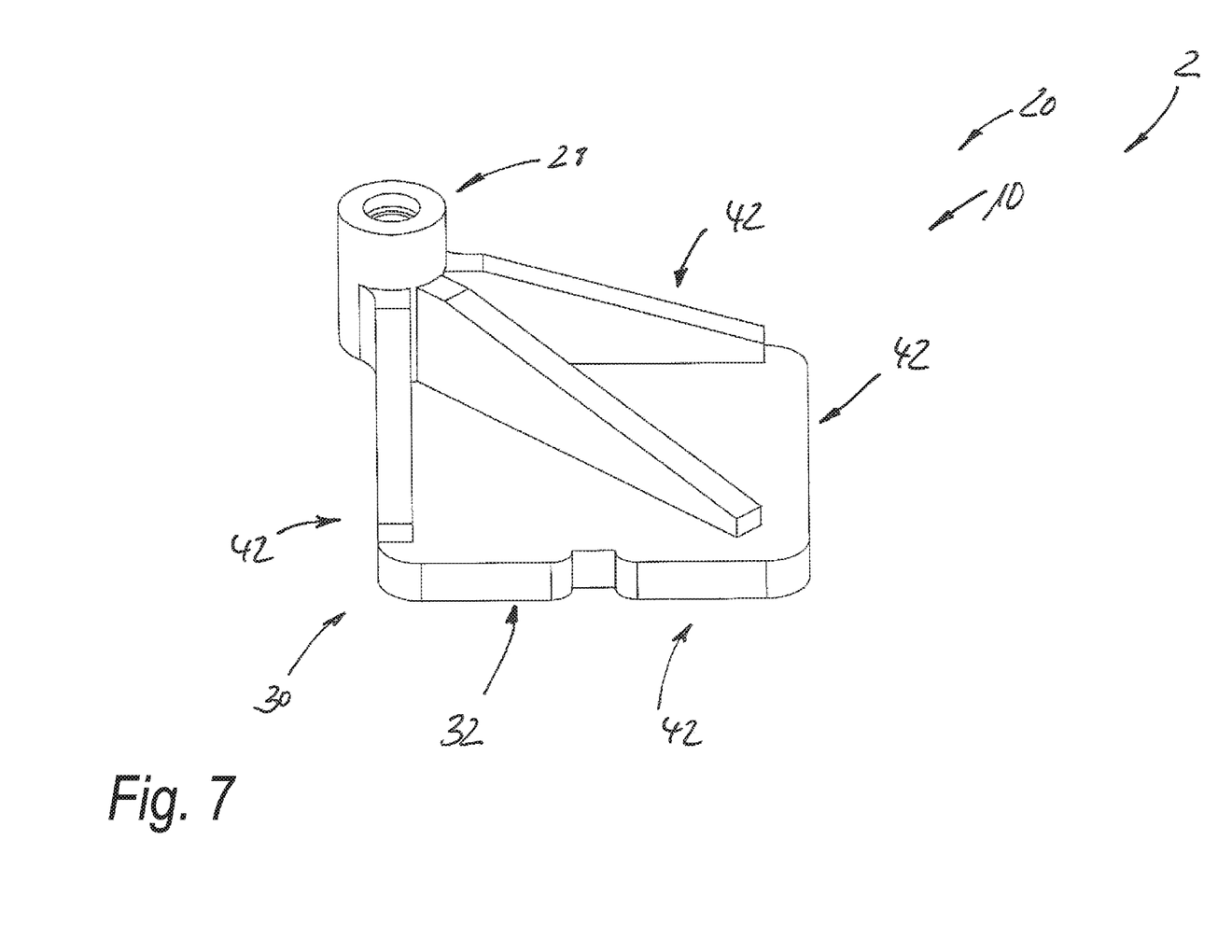
FIG. 7 a holding body for a modular electronic housing according to the invention, in a schematic perspectival view.

In FIG. 7, the representative one arrangement of head part 28 and foot part 30 of the holding body 10 is visible as this is used, in particular, in the first electronic housing 2 according to the invention. The head part 28 is thereby arranged at an outer edge 42 of the foot part 30, in order to be able to be positioned as efficiently as possible in terms of space.

Figure 8:
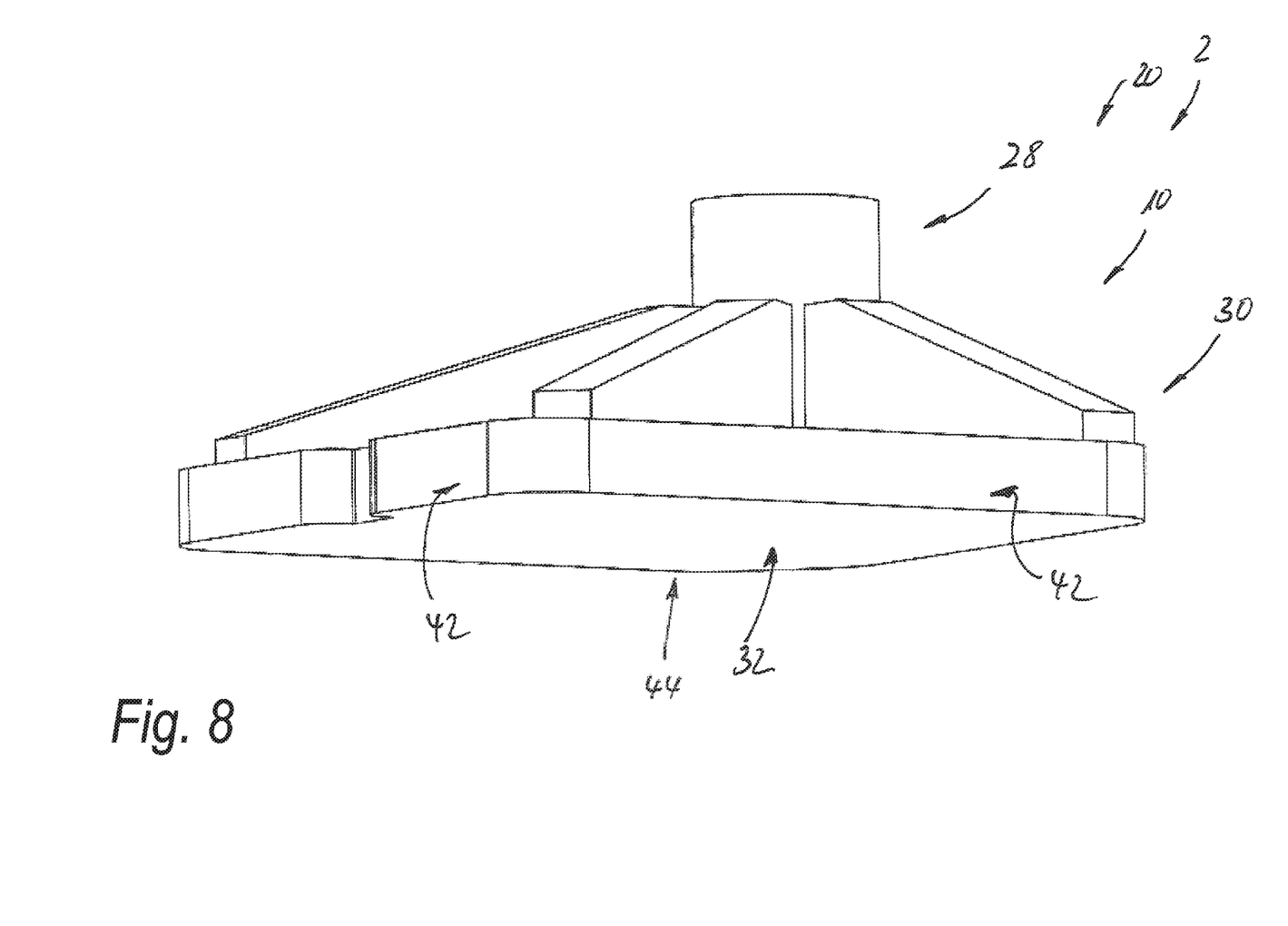
FIG. 8 the holding body from FIG. 7 in a further schematic perspectival view for illustration of a bonding surface.

Using the example of the holding body 10 shown in FIG. 7, FIG. 8 illustrates that the adhesive 26 is applied on the holding body side to a bonding surface 44 which, in the bonding position of the holding body 10, is formed at the foot part 30 and faces towards the housing series body 16 or the inner housing wall 22.

Figure 9:
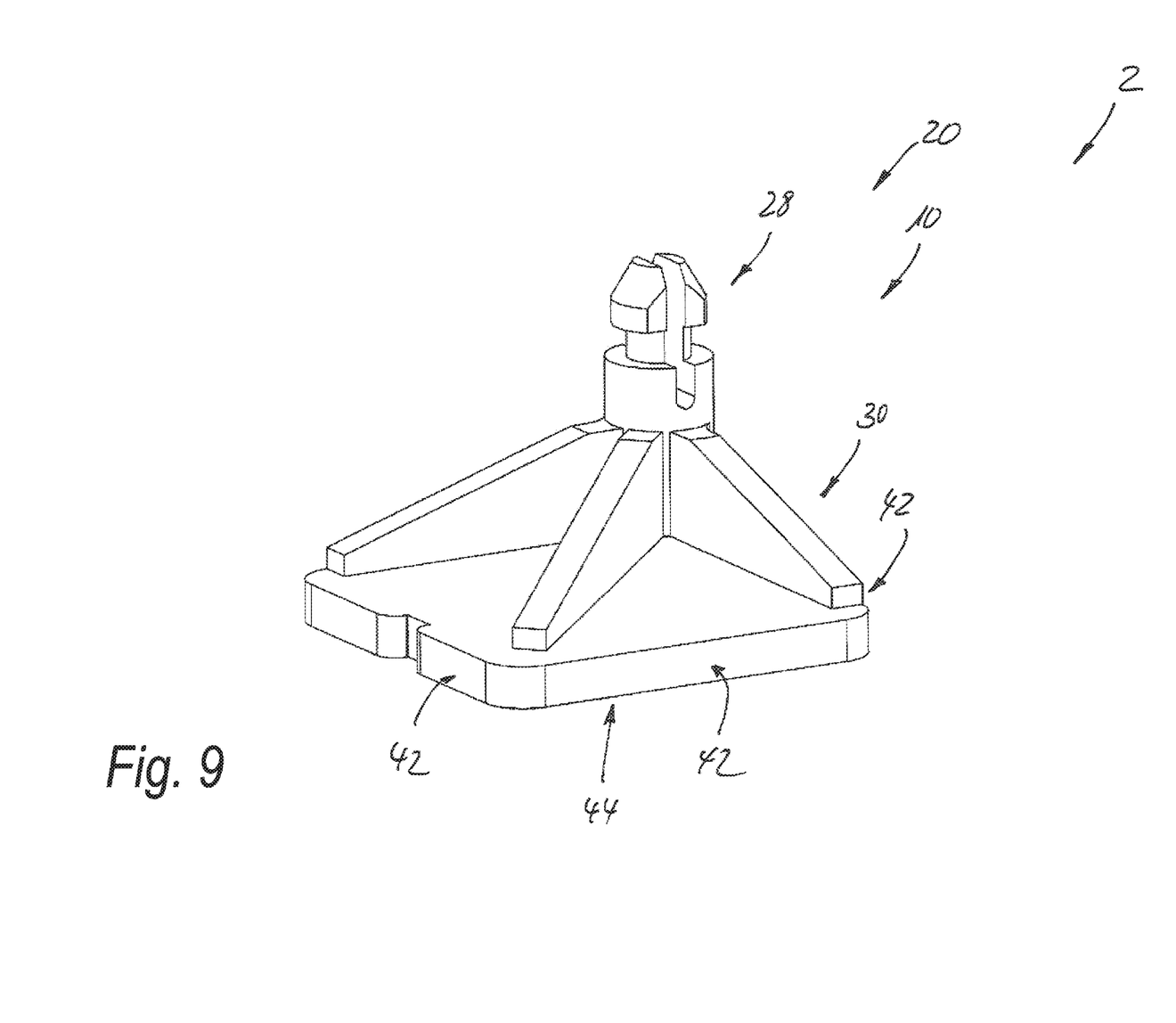
FIG. 9 an additional holding body for a modular electronic housing according to the invention, in a schematic perspectival view.

FIG. 9 shows a further holding body for a modular electronic housing 2 according to the invention, in a schematic perspectival view, wherein a maintenance of the circuit board 18 (not shown in FIG. 9, but illustrated analogously using FIGS. 3 and 4) takes place at the respective holding body 10 in a combination of positive and non-positive fits.

In the exemplary embodiments shown in the figures, the holding body 10 and also the housing series body 16 have been produced from a plastic, wherein the respective holding body 10 is formed in one piece.

The invention, as well as a method according to the invention, are not limited to the shown exemplary embodiments and holding bodies.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

Electronic housing 2
Electronic component 4
Lower housing part 6
Positioning template 8
Holding body 10
Receiving chamber 12
Positioning means 14
Housing series body 16
Circuit board 18
Maintaining device 20
Inner housing wall 22
Bonding medium 24
Adhesive 26
Head part 28
Foot part 30
Bonding surface 32
Connecting segment 38
Groove 40
Outer edge 42
Bonding surface 44
Spacer 46

The invention claimed is:

1. A modular electronic housing, comprising:
   a housing series body having a receiving chamber housing an electronic component; and
   a maintaining device configured to maintain the electronic component on the housing series body, the maintaining device having at least one holding body for the electronic component, which holding body is materially bonded to the housing series body in a bonding position,
   wherein the holding body is bonded without a fastener to an inner housing wall of the housing series body via a welded joint or adhesive bond, and
   wherein the holding body has at least one head part configured to maintain the electronic component, and a foot part configured to bond with the housing series body, which head part and foot part are arranged offset from one another such that, in a bonded position, the electronic component maintained on the holding body predominantly overlaps the foot part.

2. The modular electronic housing according to claim 1, wherein a bonding medium is introduced between holding body and housing series body.

3. The modular electronic housing according to claim 2, wherein the bonding medium comprises a pressure-sensitive adhesive.

4. The modular electronic housing according to claim 1, wherein the holding body is configured to be positioned on the housing series body by a positioning element comprising a template.

5. The modular electronic housing according to claim 1, wherein head part is arranged at an outer edge of the foot part.

6. The modular electronic housing according to claim 1, wherein the head part is connected to the foot part by an L-shaped connecting segment.

7. The modular electronic housing according to claim 1, wherein the electronic component, via positive, non-positive, or material bonding, or via a combination of positive, and/or non-positive, and/or material bonding, is maintained on the holding body.

8. The modular electronic housing according to claim 1, wherein the electronic component comprises a circuit board.

9. The modular electronic housing according to claim 1, wherein the holding body and/or the housing series body comprises, at least in segments, a plastic or a material comprising plastic.

10. A method for manufacturing a modular electronic housing, comprising:
    introducing an electronic component into a receiving chamber of a housing series body of the electronic housing; and
    maintaining the electronic component in the receiving chamber using a maintaining device, the maintaining device comprising at least one holding body which is positioned in a bonding position by a positioning element in the receiving chamber, the maintaining device being materially bonded to the housing series body in a bonding position such that the electronic component arranged thereon is maintained on the housing series body by at least the holding body,
    wherein the holding body is bonded without a fastener to the housing series body by welding and/or adhesion, and
    wherein the holding body is configured such that a foot part of the holding body, with which the holding body is materially bonded to an inner housing wall, and a head part of the holding body, at which the electronic component is arranged, are offset relative to one another such that the holding body is positioned by the positioning element such that the electronic component predominantly overlaps the foot part after it is arranged on the housing series body by the holding body.

11. The method according to claim 10, further comprising introducing a bonding medium between the holding body and housing series body, via which the holding body is materially bonded with the housing series body.

12. The method according to claim 10, wherein the bonding medium comprises a pressure-sensitive adhesive.

13. The method according to claim 10, wherein the positioning element is at least partially formed on the electronic component so that the holding body is first arranged on the electronic component and thereupon positioned together with the electronic component in the receiving chamber, and is bonded to the housing series body.

14. The method according to claim 10, wherein the positioning element comprises at least one positioning template with which the holding body is positioned on the housing series body, and
    wherein the positioning template is removed from the housing series body after the holding body is positioned.

15. The method according to claim 10, wherein the positioning element comprises at least one handling device, comprising a robot, with which the holding body is supplied to the housing series body and/or is positioned on the housing series body.

16. The method according to claim 10, wherein the electronic component comprises a circuit board.

17. The method according to claim 10, wherein the holding body and/or the housing series body comprise, at least in segments, a plastic or a material comprising plastic.

18. The method according to claim 10, wherein the electronic component, via positive, non-positive, or material bonding, or via a combination of positive, and/or non-positive, and/or material bonding, is maintained on the holding body.

19. A method for manufacturing a modular electronic housing, comprising:
    introducing an electronic component into a receiving chamber of a housing series body of the electronic housing; and
    maintaining the electronic component in the receiving chamber using a maintaining device, the maintaining device comprising at least one holding body which is positioned in a bonding position by a positioning element in the receiving chamber, the maintaining device being materially bonded to the housing series body in a bonding position such that the electronic component arranged thereon is maintained on the housing series body by at least the holding body,
    wherein the positioning element comprises at least one positioning template with which the holding body is positioned on the housing series body, and
    wherein the positioning template is removed from the housing series body after the holding body is positioned.

20. The method according to claim 19, wherein the positioning template includes at least one recess having a shape that is complementary to a shape of the at least one holding body.

* * * * *